(12) United States Patent
Chen et al.

(10) Patent No.: US 6,985,360 B2
(45) Date of Patent: Jan. 10, 2006

(54) COMPUTER ENCLOSURE INCORPORATING EXPANSION CARD MOUNTING STRUCTURE

(75) Inventors: Jung-Chi Chen, Tu-chen (TW); Kuo-Chih Lin, Tu-Chen (TW); Zhou Xu, Shenzhen (CN)

(73) Assignee: Hon Hai Precision Ind. Co., LTD, Taipei Hsien (TW)

( * ) Notice: Subject to any disclaimer, the term of this patent is extended or adjusted under 35 U.S.C. 154(b) by 216 days.

(21) Appl. No.: 10/461,591

(22) Filed: Jun. 13, 2003

(65) Prior Publication Data

US 2004/0136147 A1    Jul. 15, 2004

(30) Foreign Application Priority Data

Jan. 15, 2003    (TW) .............................. 92200670 U

(51) Int. Cl.
    *H05K 7/20*    (2006.01)
(52) U.S. Cl. ...................... 361/704; 361/697; 361/709; 165/80.3
(58) Field of Classification Search ........ 361/683–686, 361/728, 732, 740–752, 753–756, 801, 802; 312/223.1, 223.2, 223.3, 216, 293.3, 265.5, 312/265.6, 183; 211/26, 41.17; 174/35 R, 174/35 GC, 50, 50.51, 50.52, 51, 66, 67

See application file for complete search history.

(56) References Cited

U.S. PATENT DOCUMENTS

| | | | | |
|---|---|---|---|---|
| 4,964,017 | A  * | 10/1990 | Jindrick et al. ............. | 361/683 |
| 5,317,483 | A  * | 5/1994  | Swindler .................... | 361/801 |
| 6,552,913 | B2 * | 4/2003  | Tournadre .................. | 361/759 |
| 6,608,765 | B2 * | 8/2003  | Vier et al. .................. | 361/801 |
| 6,704,205 | B1 * | 3/2004  | Chen .......................... | 361/740 |
| 2001/0053060 | A1 * | 12/2001 | Gan .......................... | 361/683 |

FOREIGN PATENT DOCUMENTS

| TW | 78210118 | 3/1990 |
|---|---|---|
| TW | 84203698 | 8/1995 |
| TW | 84209619 | 11/1995 |

* cited by examiner

*Primary Examiner*—Michael Datskovkiy
(74) *Attorney, Agent, or Firm*—Wei Te Chung

(57) ABSTRACT

A computer enclosure (1) includes a chassis (50), a rear window frame (70), an expansion card seat (10) and a retaining plate (80). The chassis includes a bottom plate (53), a rear plate (52) and a side plate (53). The rear plate forms a slideway (55) and a beam (59) at a top thereof, and defines an opening between the slideway and the beam. The rear window frame includes a bottom panel (71) having a slide board (72), and an expansion slot frame (76) received in the opening. The seat includes a base plate (12) received in the opening, a supporting plate (16) extending from the base plate, a locking plate (34) extending from the supporting plate and engaging with the beam. The retaining plate is detachably attached to the seat for retaining expansion cards to the expansion card slots in the chassis.

16 Claims, 6 Drawing Sheets

COMPUTER ENCLOSURE INCORPORATING EXPANSION CARD MOUNTING STRUCTURE

BACKGROUND OF THE INVENTION

1. Field of the Invention

The present invention relates to computer enclosures, and more particularly to a computer enclosure incorporating an expansion card mounting structure which can detachably mounting an expansion card seat to a computer chassis.

2. Description of Related Art

A typical computer enclosure includes a chassis, an expansion card seat, a front bezel and a plurality of components connectable to external apparatus and systems. As disclosed in Taiwan patent applications Nos. 78210118 and 84209619, screws or rivets can be used to connect an expansion card, an expansion card seat and a chassis together. However, fixing a plurality of screws or rivets is unduly complicated and time-consuming both in assembly and in disassembly.

Another conventional mounting structure for an expansion card seat is disclosed in Taiwan patent application No. 84203698. Input/output (I/O) connectors are fixed on an I/O plate. An end of the I/O plate is inserted into a rear plate of a computer enclosure. The other end of the I/O plate is fixed to the expansion card seat with screws or rivets. This mounting structure also needs a plurality of screws or rivets. Assembly and disassembly are unduly complicated and time-consuming.

SUMMARY OF THE INVENTION

Accordingly, an object of the present invention is to provide an enclosure with an expansion card readily and reliably attached to an expansion card seat.

To achieve the above-mentioned objects, a computer enclosure comprises a chassis, a rear window frame attached to the chassis, an expansion card and a retaining plate. The chassis includes a bottom plate, a rear plate and a side plate all perpendicularly inter-connected. The rear plate forms a slideway, and a beam at a top portion thereof defines an opening between the slideway and the beam. The rear window frame comprises a bottom panel having a slide board slidably received in the slideway, and an expansion slot frame received in an end of the opening. The expansion slot frame defines an expansion card slot. The expansion card seat is attached to the rear plate. The seat comprises a base plate received in the opening of the rear plate adjacent the expansion slot frame, a supporting plate extending from the base plate, a locking plate extending from the supporting plate and engaging with the beam. The base plate defines a plurality of expansion card slots. The retaining plate is detachably attached to the seat for retaining expansion cards to the expansion card slots in the chassis.

The beam comprises a plurality of hooks on an inside face thereof. The locking plate defines a plurality of locking holes engagingly receiving the hooks. The expansion card seat further comprises a supporting plate interconnecting the base plate and the locking plate. A plurality of first posts is formed along one portion of the supporting plate. The retaining plate comprises a base plate defining a plurality of circular apertures corresponding to the first posts. The expansion slot frame comprises a second post. The retaining plate defines a recess engagingly receiving the second post.

Other objects, advantages and novel features of the present invention will become more apparent from the following detailed description when taken in conjunction with the accompanying drawings, in which:

DETAILED DESCRIPTION OF THE INVENTION

Figure 1:
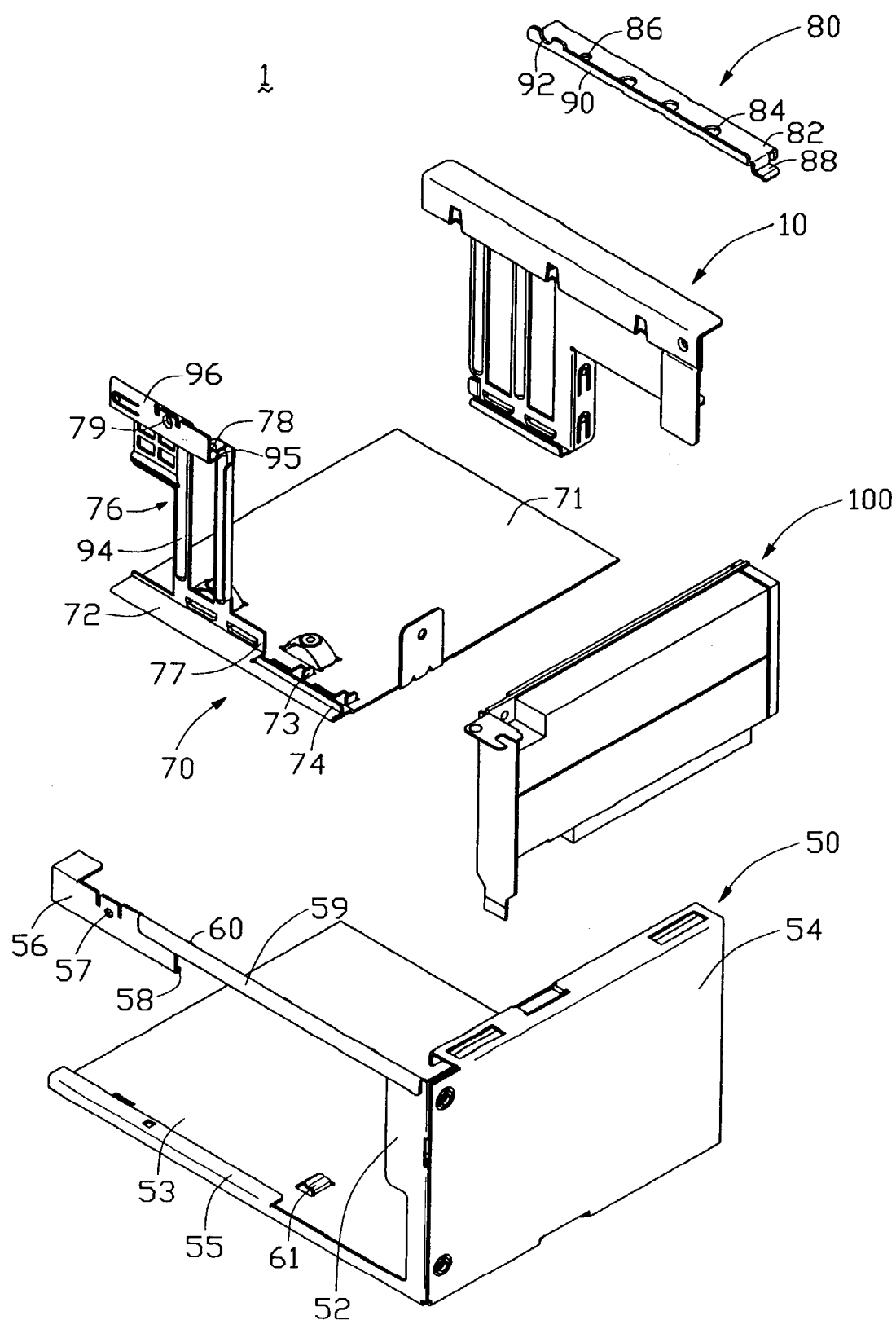
FIG. 1 is an exploded, isometric view of a computer enclosure having an expansion card mounting structure in accordance with a preferred embodiment of the present invention.
Figure 2:
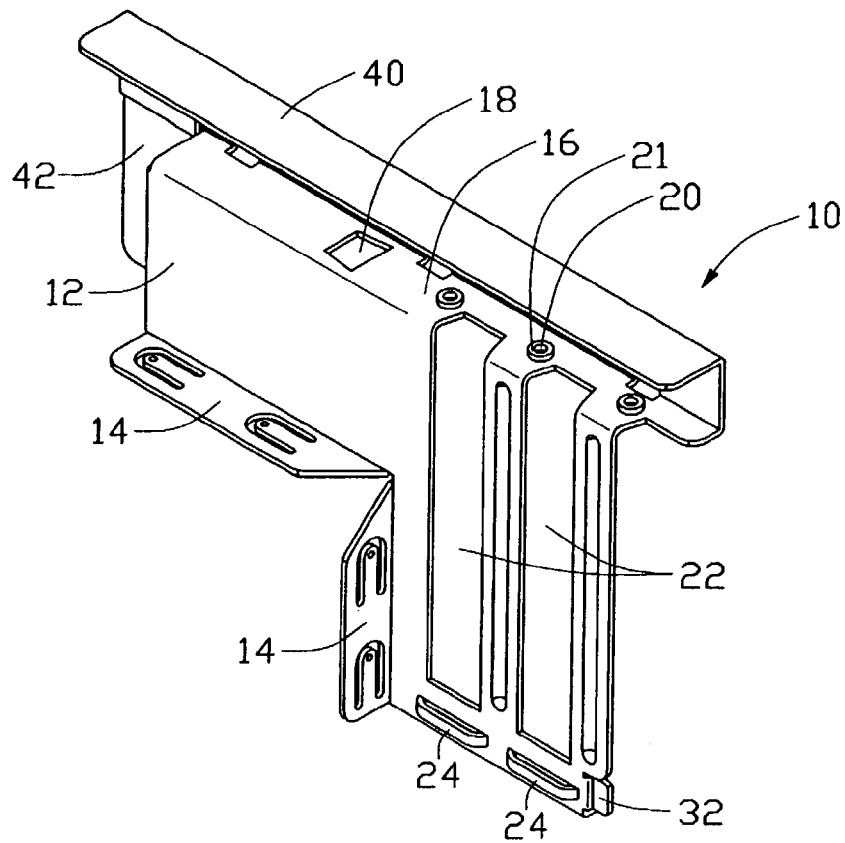
FIG. 2 is an enlarged, isometric view of an expansion card seat of the computer enclosure of FIG. 1, viewed from another aspect.
Figure 3:
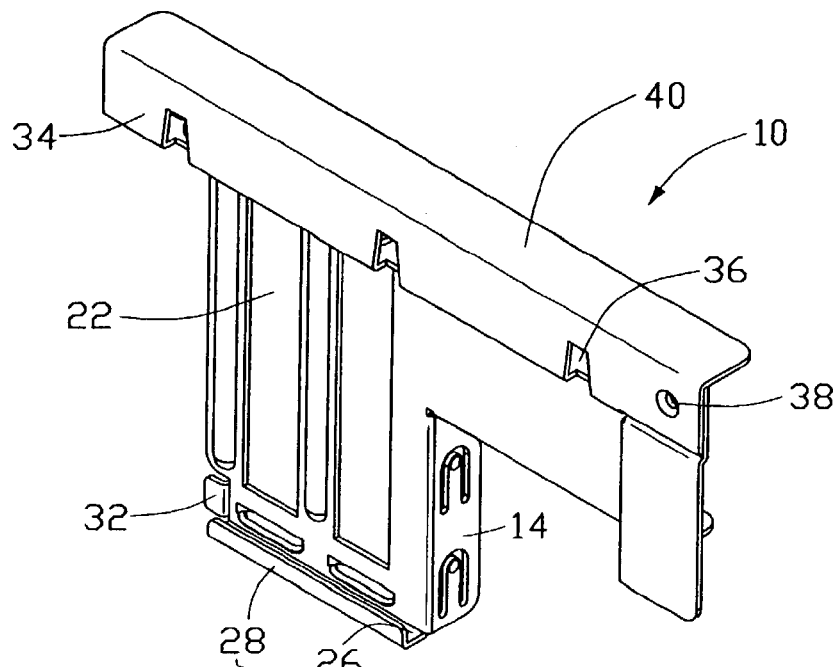
FIG. 3 is an enlarged, isometric view of the expansion card seat of the computer enclosure of FIG. 1.

Referring to FIGS. 1–3, a computer enclosure 1 in accordance with the preferred embodiment of the present invention includes an expansion card seat 10, a chassis 50, a rear window frame 70 and a retaining plate 80. The retaining plate 80 can fix one or more expansion cards 100 (only one shown) to the rear window frame 70.

The expansion card seat 10 is a generally low profile structure, and comprises a base plate 12. Two first flanges 14 extend perpendicularly inwardly from two adjacent sides respectively of the base plate 12 in an elbow thereof. Each first flange 14 has a pair of spring fingers (not labeled). A supporting plate 16 extends perpendicularly outwardly from a top of the base plate 12. A securing hole 18 is defined in a middle portion of the supporting plate 16. Three spaced first posts 21 are formed on one end of the supporting plate 16. A first circular hole 20 is defined in each first post 21. A plurality of expansion card slots 22 is defined in the base plate 12 under and between respective adjacent first circular holes 20. A plurality of protrusions is inwardly stamped from the base plate 12 below the expansion card slots 22 respectively, thereby defining a plurality of receiving slots 24 for receiving respective expansion cards 100. The bottom board 26 extends perpendicularly outwardly from a bottom of the base plate 12. A contact plate 28 extends perpendicularly upwardly from a distal end of the bottom board 26. A lowest portion of the base plate 12, the bottom board 26 and the contact plate 28 cooperatively form a second fastener 29. A first L-shaped tab 32 extends from a side edge of the lowest portion of the base plate 12 distal from the first flanges 14.

A locking plate 34 extends perpendicularly upwardly from a distal end of the supporting plate 16. A top plate 40 extends perpendicularly inwardly from a distal end of the locking plate 34. A plurality of locking holes 36 is defined in the locking plate 34. The locking plate 34 also defines a first circular bore 38 in an end thereof distal from the first circular holes 20. An L-shaped extension portion 42 extends from a side edge of the base plate 12 distalmost from the expansion card slots 22. The L-shaped extension portion 42 has an upper, slightly offset portion abutting an inside face of the locking plate 34. A second circular bore 44 (see FIG. 5) is defined in the offset portion, the second circular bore 44 coinciding with the first circular bore 38 of the locking plate 34. A fastener such as a rivet or screw is extended through the first and second circular bores 38, 44, to attach the L-shaped extension portion 42 to the locking plate 34.

The chassis 50 includes a bottom plate 53, a rear plate 52 and a side plate 54 all perpendicularly inter-connected. The rear plate 52 forms a slideway 55 at a bottom portion thereof spaced from the side plate 54. The rear plate 52 forms a beam 59 at a top portion thereof, the beam 59 being parallel to the slideway 55. An opening (not labeled) is thus defined in the rear plate 52 between the slideway 55 and the beam 59. A distal end of the beam 59 comprises a third securing plate 56 defining a retention hole 57 in a central portion thereof. A supporting body 58 extends inwardly from a bottom edge of the third securing plate 56. A plurality of hooks 60 is formed on an inside face of the beam 59 between the third securing plate 56 and the side plate 54. The hooks 60 extend upwardly, for engaging in the locking holes 36 of the expansion card seat 10. The bottom plate 53 comprises an L-shaped finger 61 extending upwardly therefrom. The side plate 54 has a protrusion 62 protruding inwardly near the rear plate 52 (see FIG. 5).

The rear window frame 70 comprises a bottom panel 71 on which a printed circuit board may be supportably mounted, the bottom panel has a slide board 72 at a rear end thereof, the slide board 72 sliding into the slideway 55. An upright stop plate 74 extends from the end of the slide board 72 near the side plate 54. A plurality of upright positioning tabs 73 is provided on the bottom panel 71 near the stop plate 74. A second flange 77 extends perpendicularly upwardly from an inner edge of the slide board 72 distal from the side plate 54. A pair of spaced, parallel columns 94 extends upwardly from the second flange 77. A connecting beam 95 extends perpendicularly outwardly from the columns 94, the connecting beam 95 interconnecting the columns 94. A second securing plate 96 extends perpendicularly upwardly from a distal end of the connecting beam 95. A second post 81 (see FIG. 5) is inwardly formed from the second securing plate 96. A second circular hole 79 is defined in the second post 81. The second flange 77, columns 94, connecting beam 95 and second securing plate 96 cooperatively form an expansion slot frame 76. When the slide board 72 is slid into the slideway 55 of the chassis 50, the finger 61 clasps the bottom panel 71 of the rear window frame 70.

The retaining plate 80 comprises a base plate 82. Three circular apertures 84 are defined in the base plate 82, corresponding to the first posts 21 of the expansion card seat 10. A second fastening hole 86 is defined in one end of the base plate 82, corresponding to the first fastening hole 78 of the rear window frame 70. A second L-shaped tab 88 extends from an opposite end of the base plate 82. A first securing plate 90 extends perpendicularly upwardly from a longitudinal edge of the base plate 82. A semicircular recess 92 is defined in a top edge portion of the first securing plate 90, for receiving the second post 81 of the rear window frame 70 therein.

Figure 4:
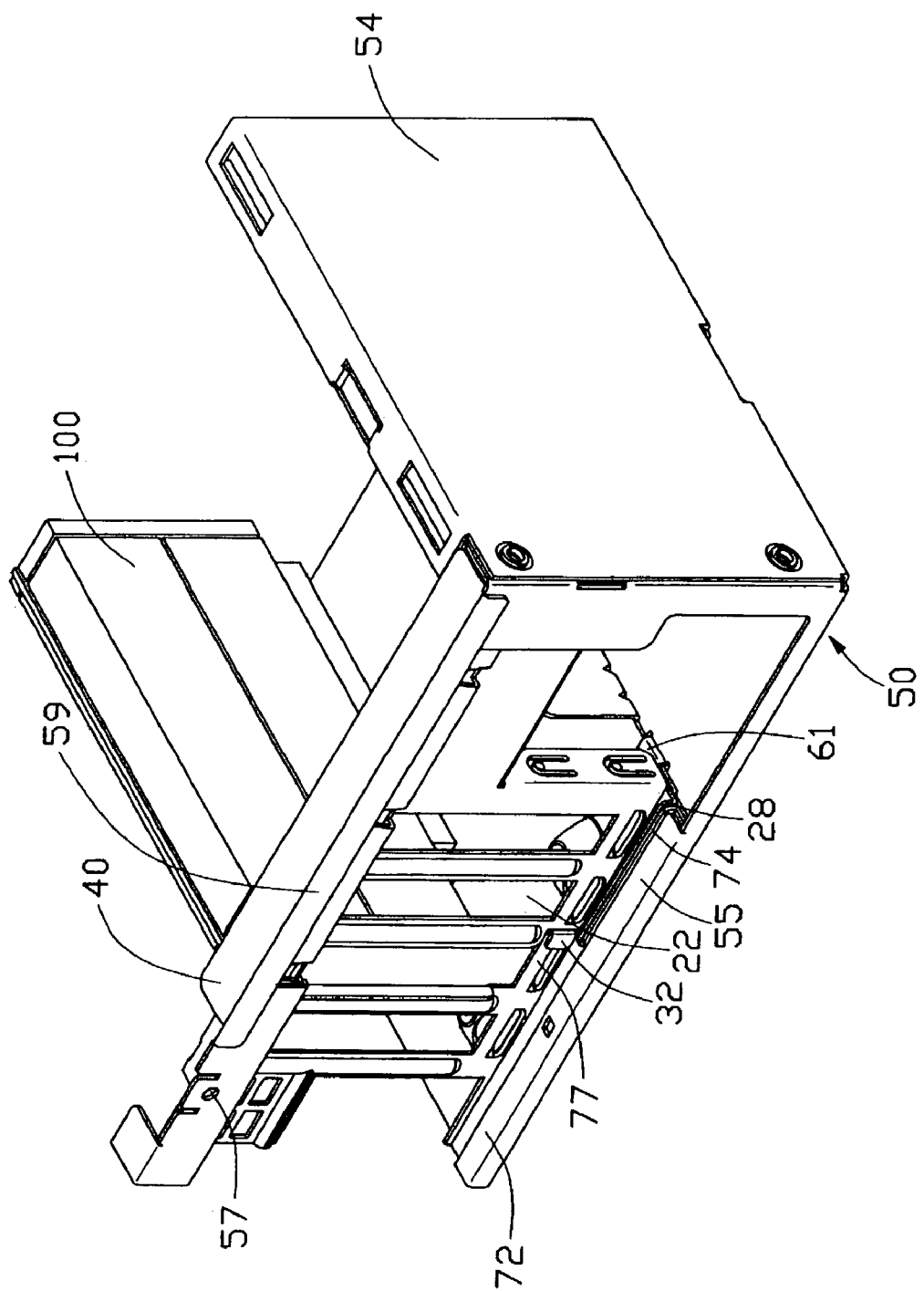
FIG. 4 is an assembled view of FIG. 1.
Figure 5:
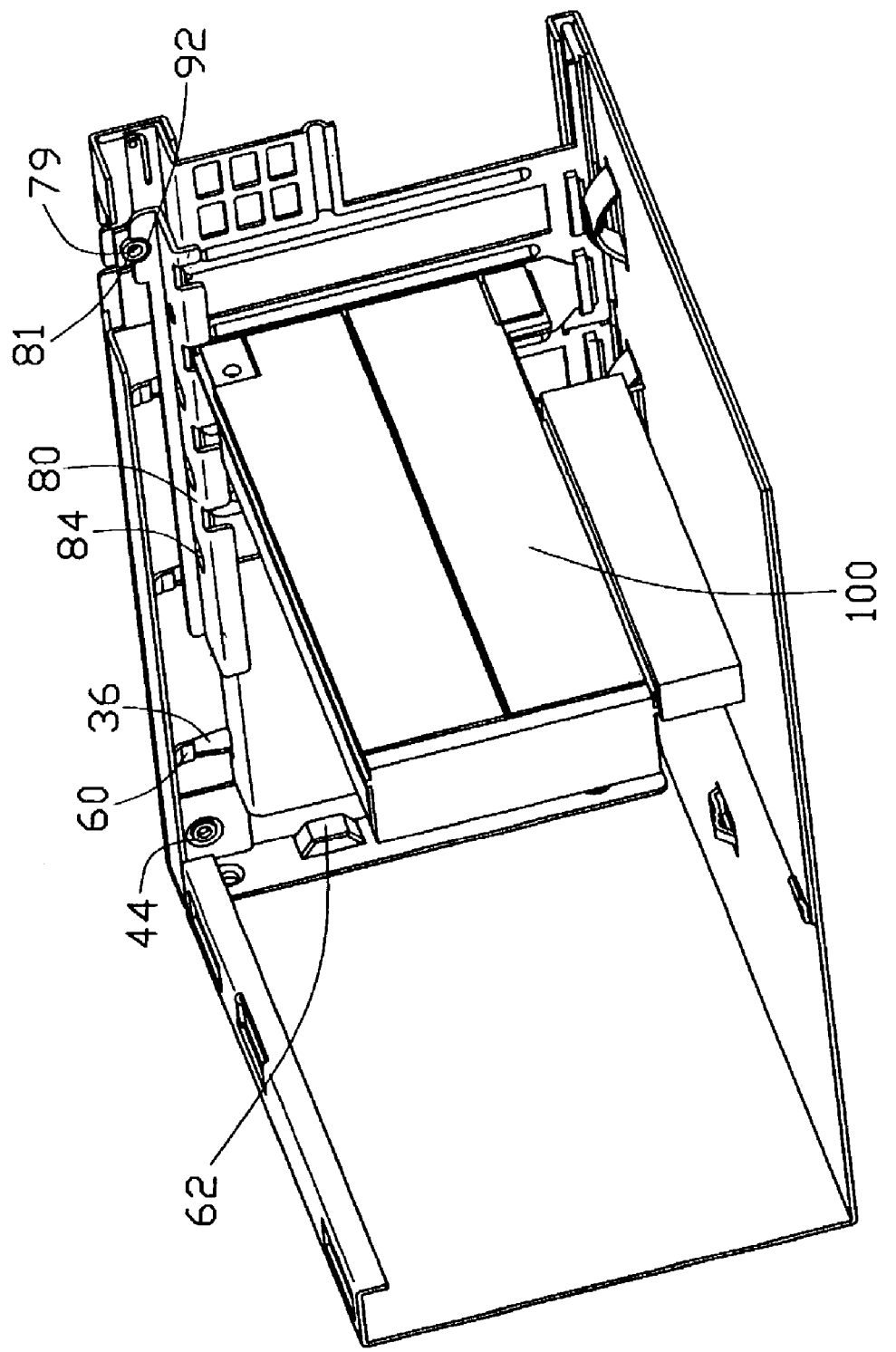
FIG. 5 is similar to FIG. 4, but showing the computer enclosure viewed from a front aspect.
Figure 6:
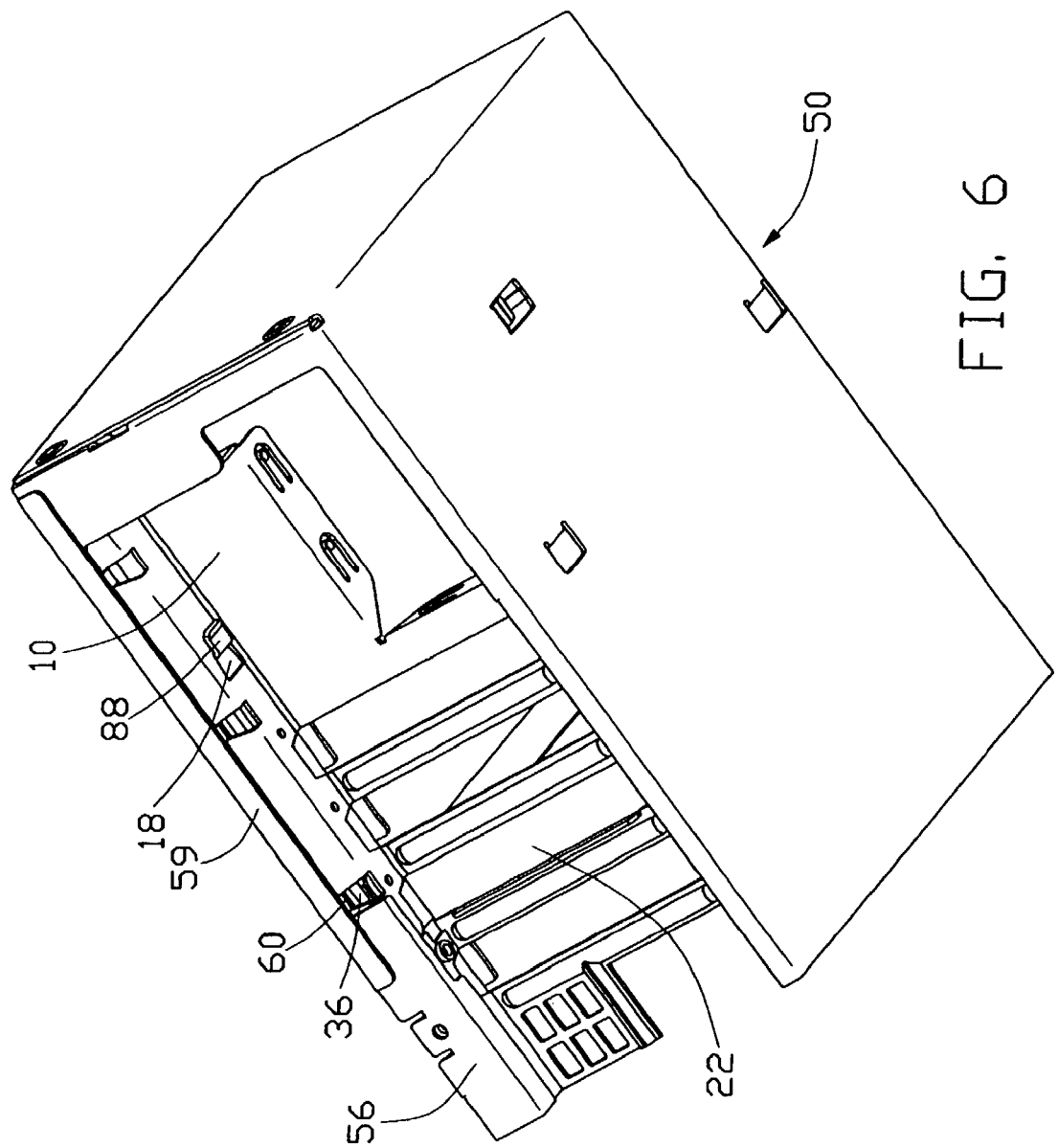
FIG. 6 is similar to FIG. 4, but showing the computer enclosure viewed from an underside aspect.

In assembly, referring to FIGS. 4–6, the slide board 72 is slid into the slideway 55 of the chassis 50 until the bottom panel 71 is clasped by the finger 61. The expansion card seat 10 is put over the rear window frame 70, so that the locking holes 36 are aligned with the hooks 60. The expansion card seat 10 is pressed downwardly to make the hooks 60 engage in the locking holes 36. The L-shaped extension portion 42 is engagingly received between the protrusion 62 of the side plate 54 and the rear plate 52. The first L-shaped tab 32 abuts against the second flange 77 of the expansion slot frame 76. The second fastener 29 of the expansion card seat 10 is disposed between the stop plate 74 and the positioning tabs 73. The expansion card 100 is fixed to the combined rear window frame 70 and expansion card seat 10 at an expansion card slot (not labeled) defined by said combination. An inserting tab (not labeled) of the expansion card 100 is inserted into a corresponding receiving slot (not labeled) of the rear window frame 70, and a cutout (not labeled) of a bent tab (not labeled) engagingly receives a corresponding first post 21 of the expansion card seat 10. The second L-shaped tab 88 of the retaining plate 80 is engagingly received in the securing hole 18 of the expansion card seat 10. The first posts 21 of the expansion card seat 10 are received in the circular apertures 84 of the retaining plate 80. Thus the retaining plate 80 is fastened to and supported on the supporting plate 16. The semicircular recess 92 of the retaining plate 80 engagingly receives the second post 81 of the expansion slot frame 76. Thus the expansion card 100 is secured to the expansion card seat 10. A screw (not shown) can be extended through the first and second fastening holes 78, 86, in order to attach the retaining plate 80 to the expansion card seat 10 even more securely. In addition, a screw (not shown) can be extended through the retention hole 57, the second circular hole 79 and the semicircular recess 92 in order to attach the retaining plate 80 to the expansion slot frame 76 even more securely.

Figure 7:
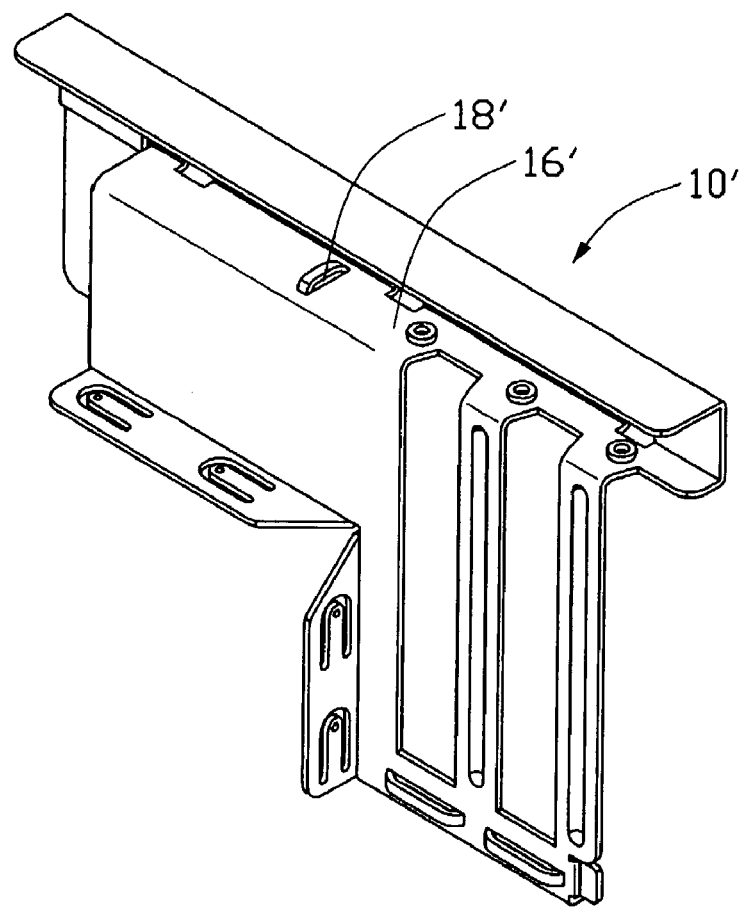
FIG. 7 is an enlarged, isometric view of an expansion card seat in accordance with an alternative embodiment of the present invention.
Figure 8:
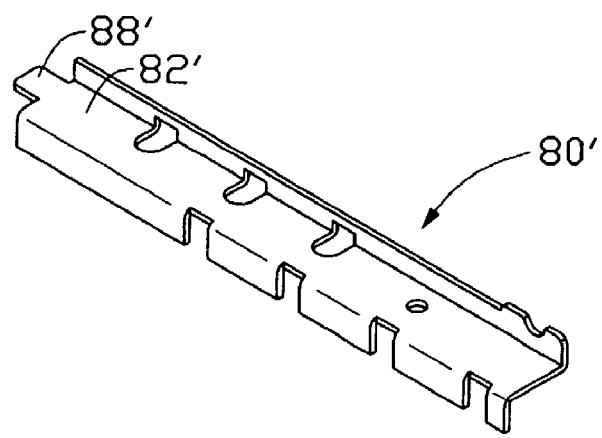
FIG. 8 is an enlarged, isometric view of a retaining plate in accordance with the alternative embodiment of the present invention.

FIGS. 7–8 show an expansion card seat 10' and a retaining plate 80' in accordance with an alternative embodiment of the present invention. The expansion card seat 10' and the retaining plate 80' are similar with the expansion card seat 10 and the retaining plate 80 of the preferred embodiment. The expansion card seat 10' also comprises a supporting plate 16'. The supporting plate 16' comprises an inverted U-shaped frame 18'. The retaining plate 80' also comprises a base plate 82'. A fastening tab 88' extends coplanarly from the base plate 82'. The fastening tab 88' is engagingly received in the inverted U-shaped frame 18' in assembly.

In a further alternative embodiment of the present invention, the chassis 50, the rear window frame 70 and the expansion card seat 10 are integrally formed as a single body.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A computer enclosure comprising:
a chassis including a bottom plate, a rear plate and a side plate all perpendicularly inter-connected, the rear plate forming a slideway, and a beam at a top portion thereof, and defining an opening between the slideway and the beam;
a rear window frame attached to the chassis, the rear window frame comprising a bottom panel having a slide board slidably received in the slideway, and an expansion slot frame received in an end of the opening, the expansion slot frame defining an expansion card slot;
an expansion card seat attached to the rear plate, the expansion card seat comprising a base plate received in the opening of the rear plate adjacent the expansion slot frame, and a locking plate engaging with the beam, the base plate defining a plurality of expansion card slots; and a retaining plate detachably attached to the expansion card seat for retaining expansion cards in the chassis at the expansion card slots.

2. The computer enclosure as claimed in claim 1, wherein a plurality of protrusions is inwardly stamped from the base plate of the expansion card seat below the expansion card slots respectively, thereby defining a plurality of receiving slots for receiving respective expansion cards.

3. The computer enclosure as claimed in claim 1, wherein the beam comprises a plurality of hooks on an inside face thereof, and the locking plate defines a plurality of locking holes engagingly receiving the hooks.

4. The computer enclosure as claimed in claim 3, wherein the expansion card seat further comprises a supporting plate interconnecting the base plate and the locking plate, a plurality of first posts is formed along one portion of the supporting plate, and the retaining plate comprises a base plate defining a plurality of circular apertures corresponding to the first posts.

5. The computer enclosure as claimed in claim 4, wherein the expansion slot frame comprises a second post, and the retaining plate defines a recess engagingly receiving the second post.

6. The computer enclosure as claimed in claim 5, wherein a first securing plate extends perpendicularly upwardly from a longitudinal edge of the base plate of the retaining plate, and the recess is semicircular, the recess being defined in a top edge portion of the securing plate.

7. The computer enclosure as claimed in claim 6, wherein a connecting beam is arranged at a top end of the expansion slot frame, a second securing plate extends perpendicularly upwardly from an end of the connecting beam, and the second post is inwardly formed from the second securing plate.

8. The computer enclosure as claimed in claim 5, wherein a tab extends from an end of the base plate of the retaining plate, the supporting plate of the expansion card seat defines a securing hole, and the securing hole engagingly receives the tab therein, thereby attaching the retaining plate on the supporting plate.

9. The computer enclosure as claimed in claim 5, wherein an inverted U-shaped retainer is formed at one end of the supporting plate, a fastening tab extends coplanarly from the base plate engagingly received in the inverted U-shaped retainer.

10. The computer enclosure as claimed in claim 1, wherein a finger extends upwardly from the bottom plate, and the finger engages with the bottom panel of the rear window frame.

11. The computer enclosure as claimed in claim 1, wherein a protrusion is inwardly formed on the side plate of the chassis near the rear plate, an extension portion extends from a side edge of the base plate of the expansion card seat distalmost from the expansion card slots, and the extension portion is engagingly received in a gap between the rear plate and the protrusion.

12. A computer enclosure comprising:

a chassis including a bottom plate, a side plate and a rear plate, an expansion card seat attached to the rear plate, the expansion card seat comprising a base plate defining a plurality of expansion card slots for accommodating expansion cards, and a supporting plate extended perpendicularly from the base plate; and a retaining plate detachably attached to the supporting plate for retaining expansion cards in the chassis at the expansion card slots, wherein the retaining plate defines a plurality of circular apertures, and the supporting plate provide a plurality of first posts extending through the circular apertures respectively; wherein the rear plate provides a second post, and the retaining plate defines a recess engagingly receiving the second post, thereby attaching the retaining plate to the supporting plate.

13. The computer enclosure as claimed in claim 12, wherein a securing plate extends perpendicularly upwardly from a longitudinal edge of the base plate of the retaining plate, the recess is semicircular, and the recess is defined in a top edge portion of the securing plate.

14. The computer enclosure as claimed in claim 12, wherein a tab extends from an end of the base plate of the retaining plate, and the supporting plate defines a securing bole engagingly receiving the tab.

15. The computer enclosure as claimed in claim 12, wherein an inverted U-shaped frame is formed at one end of the supporting plate, a fastening tab extends coplanarly from the base plate engagingly received in the inverted U-shaped frame.

16. A computer enclosure comprising:

a chassis comprising a bottom plate and defining a rear opening while leaving parallel spaced horizontally extending beam and slideway by opposite upper and lower sides of said rear opening;

a rear window frame including a bottom panel parallel to said bottom plate, and an expansion slot frame extending perpendicular to said bottom panel, said rear window frame respectively fixedly engaged with the beam and the slideway and occupying a portion of said rear opening; and an expansion card seat respectively fixedly engaged with the beam and the slideway, and occupying another portion of said rear opening; wherein said rear window frame defines at least one expansion card slot, said expansion card seat defines at least another expansion card slot, and rear window frame and said expansion card seat are side by side arranged in said rear opening.

* * * * *